US011867650B2

(12) United States Patent
McCord et al.

(10) Patent No.: US 11,867,650 B2
(45) Date of Patent: Jan. 9, 2024

(54) ENCLOSURE DETECTION FOR RELIABLE OPTICAL FAILSAFE

(71) Applicant: Apple Inc., Cupertino, CA (US)

(72) Inventors: Michael K. McCord, San Francisco, CA (US); Stacy H. Mo, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 395 days.

(21) Appl. No.: 17/223,674

(22) Filed: Apr. 6, 2021

(65) Prior Publication Data

US 2022/0317076 A1 Oct. 6, 2022

(51) Int. Cl.
*G01N 27/41* (2006.01)
*G01N 27/04* (2006.01)
*G02B 5/02* (2006.01)
*G01R 31/26* (2020.01)

(52) U.S. Cl.
CPC ......... *G01N 27/041* (2013.01); *G01N 27/045* (2013.01); *G01R 31/2635* (2013.01); *G02B 5/02* (2013.01)

(58) Field of Classification Search
CPC ............... G01N 27/041; G01N 27/045; G01N 2201/062; G01N 2035/0413; G01N 2035/0415; G01N 21/0303; G01N 21/956; G01N 15/0205; G01N 2035/00683; G01N 2035/00772; G01N 33/5438; G01R 31/2635; G02B 5/02; G02B 27/0101; G02B 23/2476
See application file for complete search history.

(56) References Cited

U.S. PATENT DOCUMENTS

| | | | |
|---|---|---|---|
| 7,304,714 B2 | 12/2007 | Peterson et al. | |
| 9,207,244 B2* | 12/2015 | Khattak | B01L 3/502715 |
| 9,901,923 B2* | 2/2018 | Lee | A61B 5/1459 |
| 10,121,950 B2 | 11/2018 | Livesay et al. | |
| 10,667,341 B1 | 5/2020 | Kriman et al. | |
| 11,035,813 B2* | 6/2021 | Wei | G06V 10/145 |
| 2020/0284883 A1 | 9/2020 | Ferreira et al. | |
| 2022/0330410 A1* | 10/2022 | Shanjani | H02J 50/10 |

FOREIGN PATENT DOCUMENTS

WO      2020185523 A1     9/2020

* cited by examiner

*Primary Examiner* — Vinh P Nguyen
(74) *Attorney, Agent, or Firm* — Treyz Law Group; Jason Tsai

(57) ABSTRACT

Optical component integrity monitoring circuitry monitors an optical component integrity sensing path in an optical component. If a rise in resistance of the sensing path is detected, the circuitry prevents the optical component from emitting light. The optical component may have a light-emitting device that emits light through an optical element. The sensing path may have a first path that is used to detect damage to the optical element and a second path that is coupled to a package covering the optical element and light-emitting device. The first path may have a segment formed from a metal trace on the optical element and a segment formed from a wire bond, providing mechanical compliance to tolerate strains expected in the use case. The second path ensures that the package is present to constrain movement of the optical element and its wires within a safe envelope defined by the package interior.

20 Claims, 11 Drawing Sheets

US 11,867,650 B2

ENCLOSURE DETECTION FOR RELIABLE OPTICAL FAILSAFE

FIELD

This relates generally to electronic devices, and, more particularly, to electronic devices with optical components.

BACKGROUND

Electronic devices such as tablet computers, cellular telephones, and other equipment are sometimes provided with optical components. These optical components may include light-emitting devices and corresponding optical elements sensors such as diffusers. To ensure that the optical components are operated within desired limits, failsafe mechanisms may be deployed.

SUMMARY

Electronic devices may have optical components. For example, a portable electronic device such as a cellular telephone, tablet computer, or other device may have an optical component that emits light. The optical component may have an optical element such as a diffuser or other optical element and may have a laser that emits light through the optical element.

The electronic device may have optical component integrity monitoring circuitry that monitors an optical component integrity sensing path in the optical component. If a rise in resistance of the sensing path is detected, the circuitry can prevent the optical component from emitting light.

The sensing path may have a first path that is used to detect damage to the optical element and a second path that is coupled to a package covering the optical element and light-emitting device to detect movement of the optical element. The first path may have a segment formed from a metal trace on the optical element and a segment formed from a wire bond. The second path may include solder joints.

DETAILED DESCRIPTION

Figure 1:
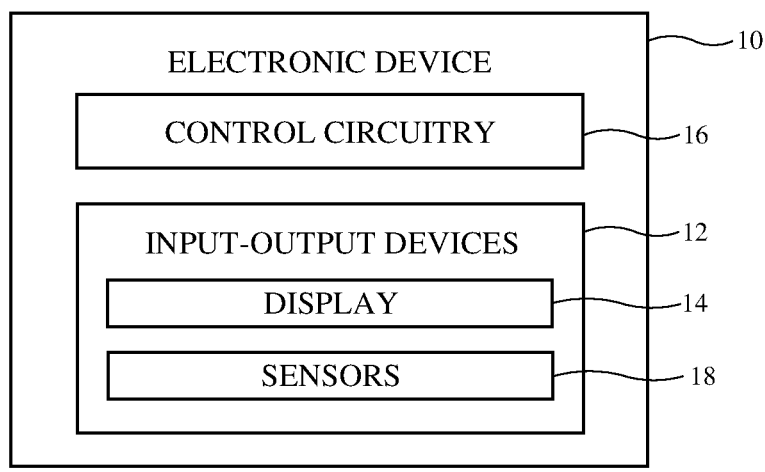
FIG. 1 is a schematic diagram of an illustrative electronic device in accordance with an embodiment.

A schematic diagram of an illustrative electronic device that may include one or more optical components is shown in FIG. 1. Electronic device 10 of FIG. 1 may be a computing device such as a laptop computer, a computer monitor containing an embedded computer, a tablet computer, a cellular telephone, a media player, or other handheld or portable electronic device, a smaller device such as a wristwatch or other device worn on a user's wrist, a pendant device, a headphone or earpiece device, a head-mounted device such as eyeglasses, goggles, or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. Illustrative configurations in which device 10 is a portable device such as a cellular telephone or tablet computer of may sometimes be described herein as an example.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc. Control circuitry 16 may include communications circuitry for supporting wired and/or wireless communications between device 10 and external equipment. For example, control circuitry 16 may include wireless communications circuitry such as cellular telephone communications circuitry and wireless local area network communications circuitry.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, haptic output devices, cameras, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be an organic light-emitting diode display, a display formed from an array of crystalline semiconductor light-emitting diode dies, a liquid crystal display, or other display. Display 14 may be a touch screen display or a display that is insensitive to touch.

As shown in FIG. 1, input-output devices 12 may include sensors 18. Sensors 18 may include capacitive sensors, light-based proximity sensors, magnetic sensors, accelerometers, force sensors, touch sensors, temperature sensors, pressure sensors, inertial measurement units, accelerometers, gyroscopes, compasses, microphones, radio-frequency sensors, three-dimensional image sensors (e.g., structured light sensors with light emitters such as infrared light emitters configured to emit structured light and corresponding infrared image sensors, three-dimensional sensors based on pairs of two-dimensional image sensors, etc.), cameras (e.g., visible light cameras and/or infrared light cameras with or without associated flood illuminators and/or flash systems), light-based position sensors (e.g., lidar sensors), monochrome and/or color ambient light sensors, and other sensors. Sensors 18 such as ambient light sensors, image sensors, optical proximity sensors, lidar sensors, optical touch sensors, and other sensors that use light and/or components that emit light such as status indicator lights and other light-emitting components may sometimes be referred to as optical components. If desired, sensors 18 may include integrity monitoring (failsafe) sensors.

Figure 2:
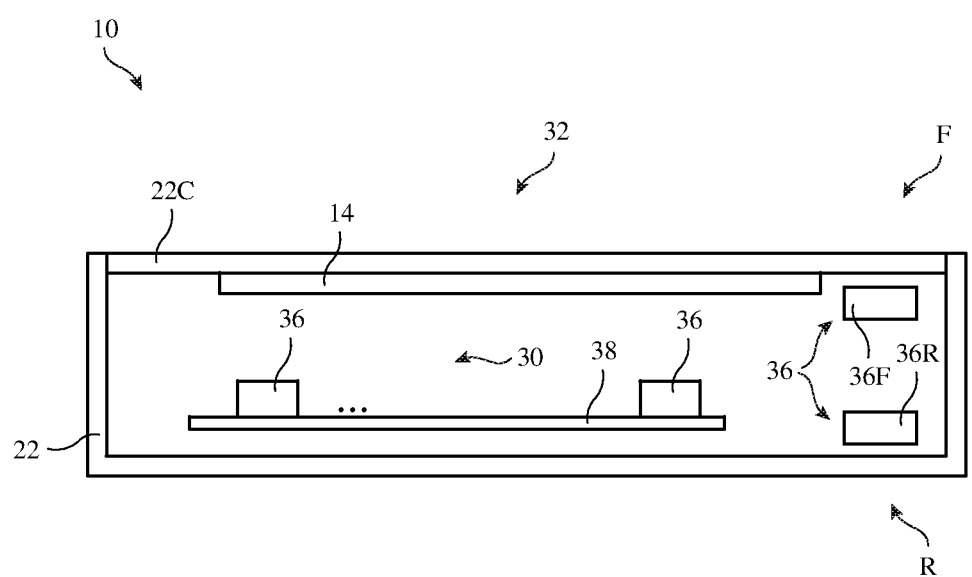
FIG. 2 is a cross-sectional side view of an illustrative electronic device in accordance with an embodiment.

A cross-sectional side view of an illustrative electronic device is shown in FIG. 2. As shown in FIG. 2, device 10 may include housing 22. Housing 22, which may sometimes be referred to as an enclosure or case, may be formed of plastic, glass, ceramics, fiber composites, metal (e.g., stainless steel, aluminum, etc.), other suitable materials, or a combination of any two or more of these materials. In the example of FIG. 2, device 10 has a front F and an opposing rear R. Display 14 may be mounted at front F and may be covered by a transparent portion of housing 22 such as display cover layer 22C.

As shown in the cross-sectional side view of device 10 of FIG. 2, housing 22 (including portion 22C) may separate an interior region of device 10 such as interior region 30 from an exterior region surrounding device 10 such as exterior region 32. Housing 22 may be formed using a unibody configuration in which some or all of housing 22 is machined or molded as a single structure or may be formed using multiple structures (e.g., an internal frame structure, one or more structures that form exterior housing surfaces, etc.). If desired, a strap may be coupled to a main portion of housing 22 (e.g., in configurations in which device 10 is a wristwatch or head-mounted device).

Optical components 36 and/or other internal electrical components (e.g., integrated circuits, discrete components, light sources, light detectors, cameras, and other optical components, etc.) for forming control circuitry 16 and input-output devices 12 may be mounted in interior 30 of housing 22 (e.g., on one or more substrates such as printed circuit 38). In some configurations, components may be mounted in interior 30 adjacent to display 14 and/or adjacent to a rear housing wall portion of housing 22 at rear R. For example, one or more front-facing optical components such as component 36F may be mounted under a portion of display cover layer 22C and may be configured to operate in a front-facing arrangement and/or one or more rear-facing optical components such as component 36R may be mounted under a transparent rear housing wall in housing 22, under a rear-facing optical window, etc. Components such as optical components 36F and 36R may be formed in any suitable portion of device 10 and may be mounted to one or more printed circuits such as printed circuit 38. The example of FIG. 2 is illustrative.

Figure 3:
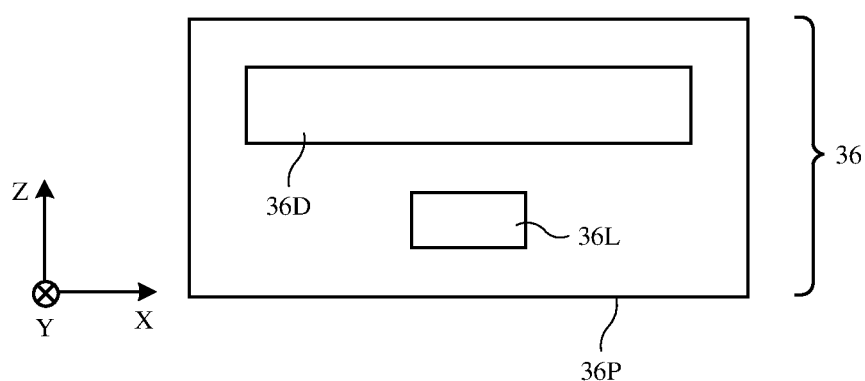
FIG. 3 is a side view of an illustrative optical component in accordance with an embodiment.

Optical components 36 may include components that emit and/or detect light (see, e.g., light-based components in sensors 18), may include flood illuminators for image sensors and/or other sensors (e.g., flood illuminators that emit flood infrared illumination), may include gaze tracking sensors (e.g., light emitters that create glints for a gaze tracker), may include components that emit structured light (e.g., arrays of lasers covered with optical elements that split emitted beams into additional beams), may include optical proximity sensors that emit and detect infrared light, may include time-of-flight sensors, lidar sensors, and/or other optical components. FIG. 3 is a cross-sectional side view of an illustrative optical component. As shown in FIG. 3, optical component 36 may include a light source such as light-emitting device 36L and an optical element such as optical element 36D. Device 36L and element 36D may be mounted in an enclosure such as optical component package 36P. Package 36P may be formed from polymer and/or other materials.

Light-emitting device 36L may be, for example, a laser device having one or more semiconductor lasers (e.g., one or more vertical cavity surface-emitting lasers and/or other laser diodes). Optical element 36D may be a diffractive optical element, a diffuser, a lens, a prism, a mirror, a lens array, a layer of meta lenses, a filter, and/or other optical element that reflects, focuses, diffuses, diffracts, refracts, and/or otherwise modifies light emitted by device 36L. In an illustrative configuration, which may sometimes be described herein as an example, device 36L is a laser and optical element 36D is a diffuser (e.g., a laser and diffuser used together in providing infrared flood illumination for an infrared camera). In general, however, device 36L may be any component that emits light and element 36D may be any light-modifying optical structure.

To ensure eye safety for users of device 10, optical component 36 is provided with redundant safety mechanisms. For example, component 36 may be powered by current limiting circuitry. This circuitry dynamically monitors the current flowing through laser 36L and prevents excess current from flowing, thereby restricting the magnitude of emitted light from laser 36L. Failsafe mechanisms based on failsafe resistors and/or other integrity monitoring signal paths are also incorporated into component 36 to ensure that physical damage to component 36 does not result in undesired operating modes. These failsafe features may, for example, detect whether optical element 36D has become damaged or dislodged.

Damage to optical element 36D may include cracking or chipping that results when device 10 is dropped or otherwise exposed to excessive stress by a user. A drop event or other excessive force event may also potentially dislodge element 36D from support structures on which element 36D has been mounted. To detect both of these types of potential damage, the failsafe mechanism of device 10 can incorporate multiple integrity sensing paths. These paths, which are sometimes called integrity paths, integrity sensing lines, integrity monitoring signal paths, sensing resistors, sense traces, sensing lines, sensors, etc., may include a first path (sometimes called an optical element integrity sensing path) that is used to detect damage to optical element 36D such as chipping and/or cracking and a second path (sometimes called an optical component package integrity sensing path) that is used to detect whether package 36P has been dislodged (e.g., due to contact with a dislodged optical element within package 36P).

Optical integrity monitoring circuitry (e.g., circuitry forming some or all of an integrated circuit and/or other circuitry in control circuitry 16 of FIG. 1) may be used to continually monitor the states of the first and second sensing paths. If the paths experience a change in resistance (e.g., if either or both of the paths becomes an open circuit or otherwise exhibits an increase resistance above a desired nominal value), current to component 36 can be blocked.

Figure 4:
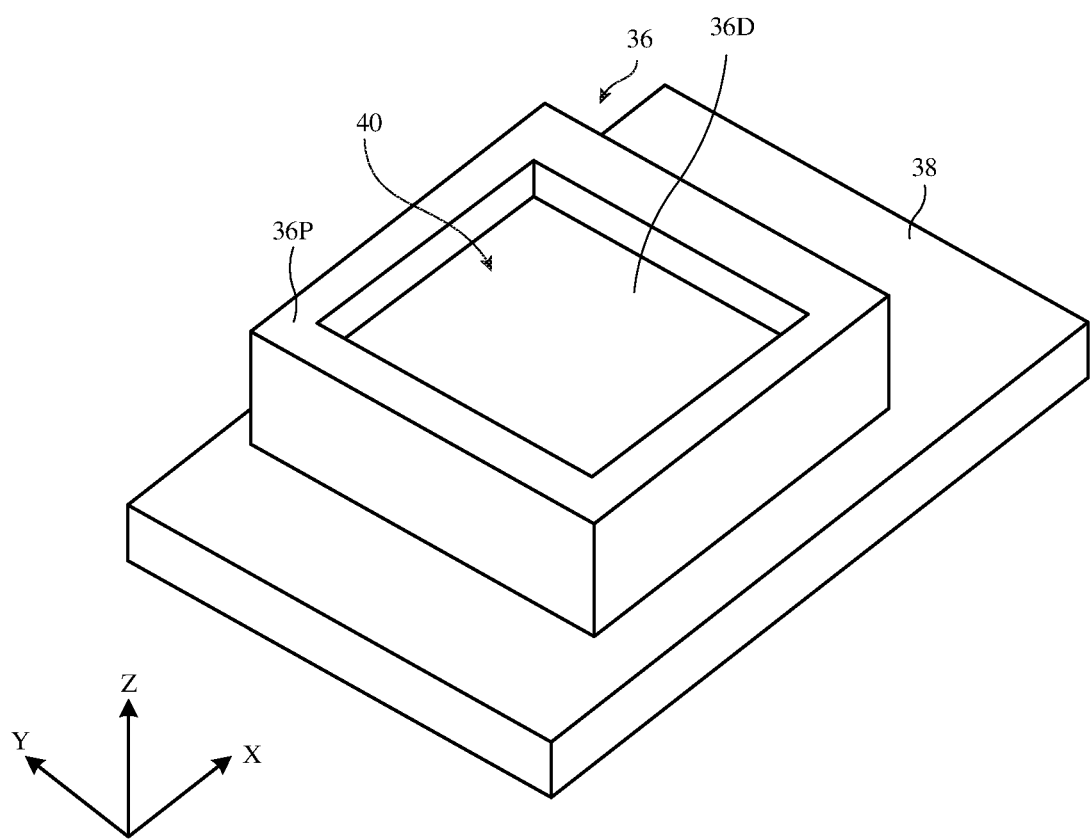
FIG. 4 is a perspective view of an illustrative optical component in accordance with an embodiment.

FIG. 4 is a perspective view of optical component 36 in an illustrative configuration in which package 36P has the shape of a box with an outwardly facing opening 40. Optical element 36D may be mounted within the interior of package 36P in alignment with opening 40. During operation, device 36L may emit light that passes through optical element 36D and opening 40. This light may exit device 10 through the front or rear of device 10 (see, e.g., components 36F and 36R of FIG. 2, as examples).

Figure 5:
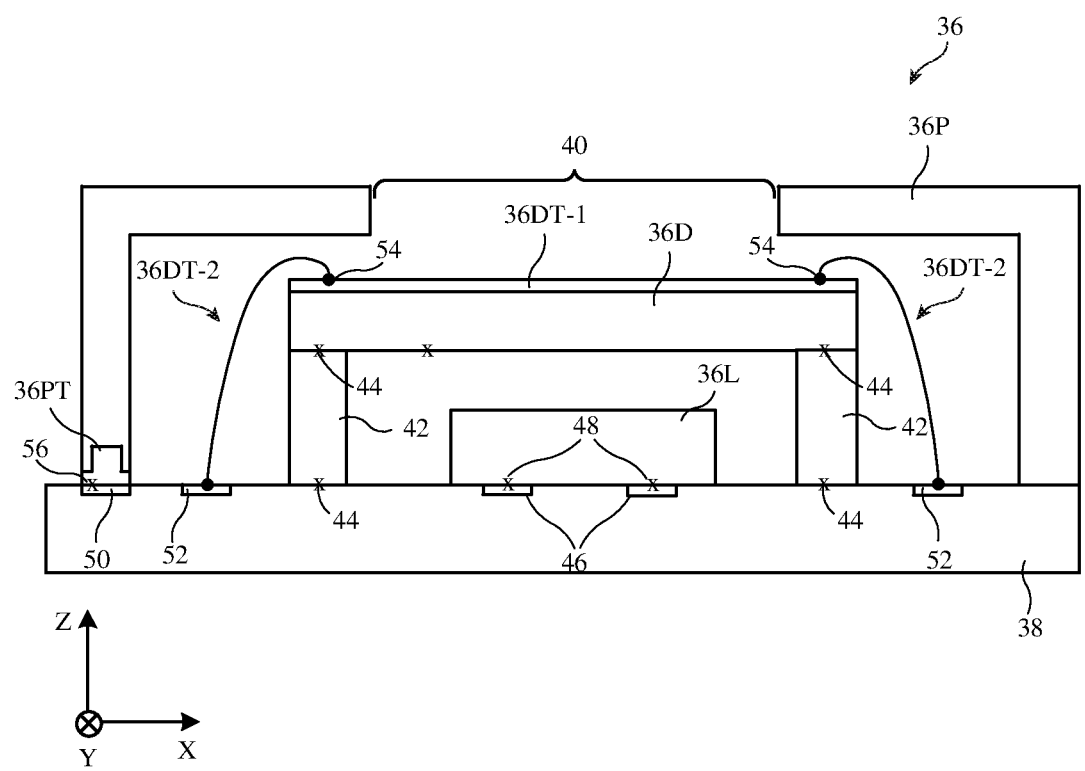
FIG. 5 is a cross-sectional side view of an illustrative optical component in accordance with an embodiment.

As shown in the cross-sectional side view of FIG. 5, package 36P may have an open bottom. This allows package 36P to serve as an enclosure that covers both element 36D and device 36L. Support structures 42 (e.g., posts, a ring-shaped member, and/or other supporting structures) may be used to support element 36D on printed circuit 38. Printed circuit 38 may be a rigid printed circuit, a flexible printed circuit (e.g., a printed circuit formed from a sheet of polyimide or other flexible polymer layer), or other printed circuit onto which circuitry in addition to component 36 is mounted and/or may be a printed circuit that is used to form part of component 36. Support structures 42 may be attached at joints 44 (e.g., adhesive joints, welds, fastener joints, etc.). Device 36L may be electrically and physically mounted to contacts 46 on printed circuit 38 using electrical connects 48 (e.g., solder joints).

Zig-zag thin-film metal traces and/or other integrity monitoring path(s) 36DT-1 may be formed on element 36D. Path 36DT-1 may, as an example, include thin metal lines that are nominally unbroken, but which will break when cracks or chips are present on element 36D. This allows the state of path 36DT-1 to serve as part of a sensing path (sometimes referred to as a failsafe resistor) that can detect whether element 36D has been damaged. Path 36DT-1 may be connected to path(s) 36DT-2 at connections 54. In an illustrative configuration, path 36DT-2 is a wire bond path and connections 54 are wire bonds. The wires of path 36DT-2 may be coupled to contacts 52 on printed circuit 38 (e.g., using wire bond connections). Together, path segment 36DT-1 and path segment 36DT-2, which are coupled in series, form a first optical component integrity monitoring path. This first path is used to monitor for potential damage (chips, cracks, etc.) to element 36D and may therefore be referred to as an optical element integrity sensing path or optical element damage sensing path.

Figure 6:
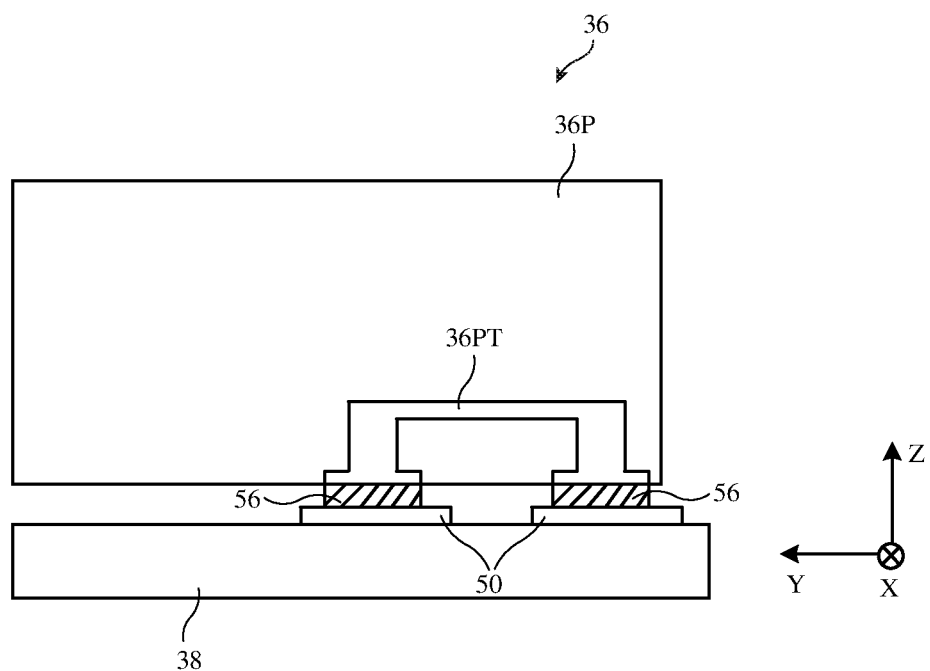
FIG. 6 is a side view of an illustrative optical component in accordance with an embodiment.

During severe drop events and other undesired high-stress events, element 36D may become dislodged from support structure 42 and may therefore move within package 36P. Motion of element D could impact the alignment of element 36D relative to device 36L. The use of wires or other compliant failsafe structures can provide resilience against strains imposed during a drop event, but may allow motion of element 36D. When package 36P is present and intact, movement of device 36D is constrained to be safe. To ensure satisfactory failsafe operation in the event that device 10 is dropped or otherwise causes element 36D to move, movement may be monitored using a second optical component integrity monitoring path. This second path detects when element 36D moves sufficiently to contact adjacent portions of package 36P and thereby dislodge package 36P from printed circuit 38. In particular, package 36P may have a metal member or other structure (e.g., a metal trace, etc.) that forms optical component package integrity sensing path 36PT. Path 36PT may be electrically and physically coupled to printed circuit 38 using connections 56. Connections 56 may be, for example, solder joints that couple terminals at two opposing ends of path 36PT to respective contacts 50 on printed circuit 38. FIG. 6 is a side view of component 36 of FIG. 5 viewed along the X axis of FIG. 5. As shown in FIG. 6, path 36PT may be formed from a conductive metal member that is insert molded within a polymer material forming package 36P. The ends of the metal member may be electrically connected to contacts 50 on printed circuit 38 using solder joints (connections 56).

The first and second sensing paths in this type of arrangement have different characteristics.

The relatively long lengths of wire bond path 36DT-2 in the first sensing path make the wire bond portions of the first sensing paths compliant (e.g., the wire bonds may have slack that allows the wire bonds to bend and expand slightly due to movement of element 36D without failing). As a result, paths 36DT-2 allow element 36D to move somewhat without prematurely forming open circuits. The use of wire bonds or other compliant electrical connections in forming electrical connections between contacts 52 and path 36DT-1 on optical element 36D therefore helps to enhance reliability when monitoring for damage in optical element 36D using path 36DT-1 on element 36D.

With the second sensing path, the metal member of path 36PT is coupled to contacts 50 using solder joints 56. Solder joints (e.g., solder joints of about 25-80 microns in thickness) are relatively brittle and are therefore less compliant than wire bonds. As a result, joints 56 will not exhibit significant slack. It may take significant force from element 36D contacting package 36P to break solder joints 56. But while joints 56 may withstand considerable force, the non-compliant nature of joints 56 will ensure that joints 56 fail before allowing package 36P to move enough that it no longer constrains the motion envelope of element 36D.

Figure 7:
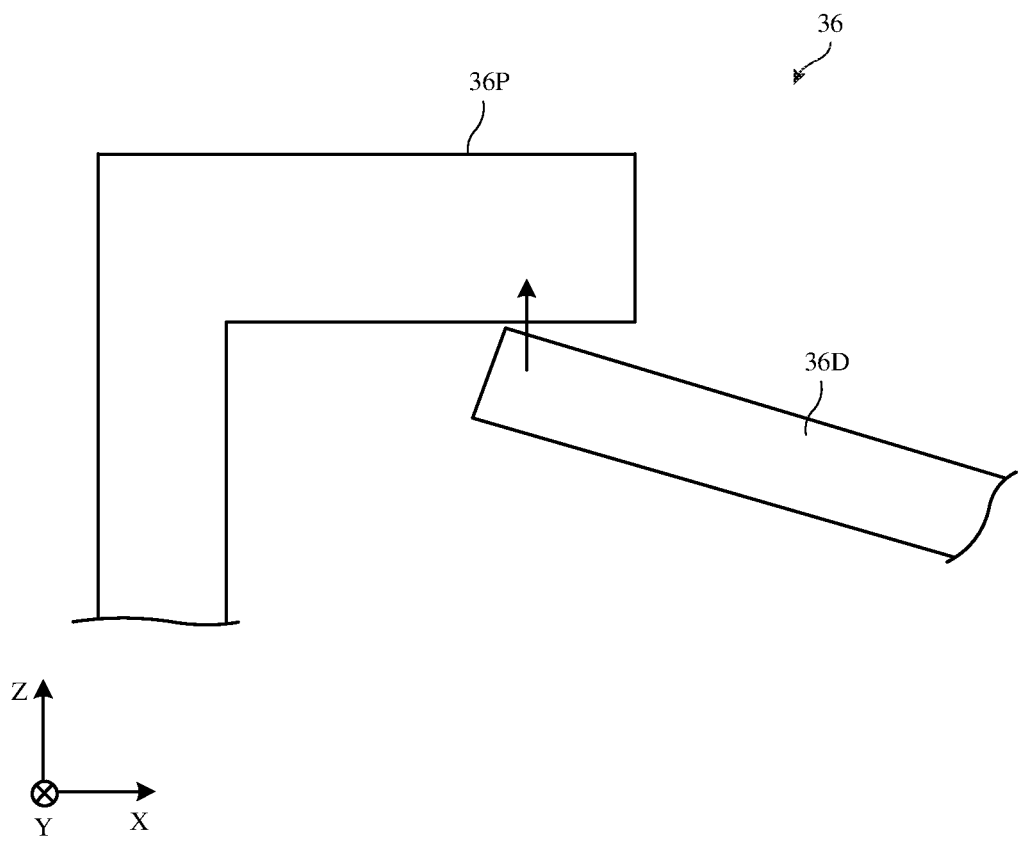
FIG. 7 is a cross-sectional side view of an illustrative optical component in which an optical element has moved and is contacting a package portion of the component in accordance with an embodiment.
Figure 8:
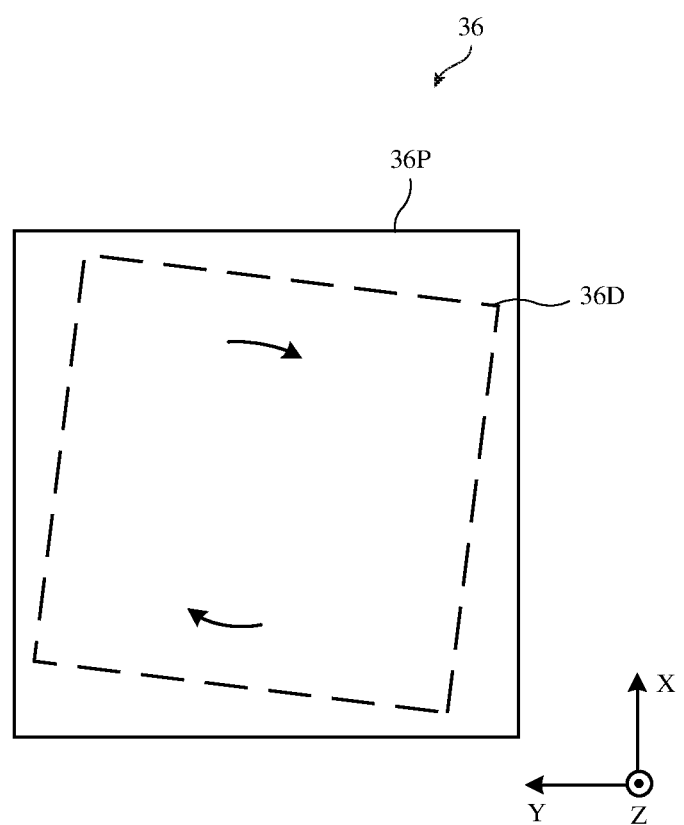
FIG. 8 is a top view of an illustrative optical component illustrating how rotational movement of an optical element in the component will be detected by contact between the optical element and a package portion of the component in accordance with an embodiment.

As shown in FIG. 7, for example, if element 36D becomes dislodged from support structures 42 and tilts upwards, element 36D will span the nominal gap between element 36D and the facing inner surface of package 36P and will therefore contact package 36P. So long as solder joints 56 are intact, package 36P will constrain undesired further motion of package 36P to ensure safety. In the event that excessive force is applied by element 36D to package 36P, joints 56 will fail and package 36P will become dislodged from printed circuit 38. The use of a brittle (less compliant) path design for the second sensing path helps ensure that element 36D is not able to move excessively without detection. As shown in the top view of component 36 of FIG. 8, the inner surface of package 36P may, if desired, be configured to permit a finite amount of rotational motion of element 36D relative to printed circuit 38 before package 36P is dislodged.

The size of the gaps between element 36D and package 36P can be configured to establish a desired permitted amount of movement (e.g., tilting, shifting, and/or rotation) in element 36D relative to printed circuit 38. Further movement of element 36D after element 36D contacts package 36P is constrained by package 36P and joints 56, which hold package 36P in place on printed circuit 38. In the event that solder joints 56 are overstressed and package 36P begins to move, joints 56 will open and this open circuit will be detected. If, as an example, the gaps between element 36D and package 36P are small, the second sensing path will be sensitive to movement of element 36D beyond this relatively small distance. On the other hand, if the gaps are larger, the second sensing path will permit more movement of element 36D. As one example, the minimum distance between element 36D and package 36P may be set to a value between 50 and 200 microns. In general, the gaps may be at least 20 microns, at least 50 microns, at least 100 microns, at least 300 microns, less than 500 microns, less than 250 microns, less than 150 microns, or other suitable size.

The strength with which path 36PT is embedded within package 36P must exceed the strength of joints 56, ensuring that any movement of package 36P will break the circuit.

Figure 9:
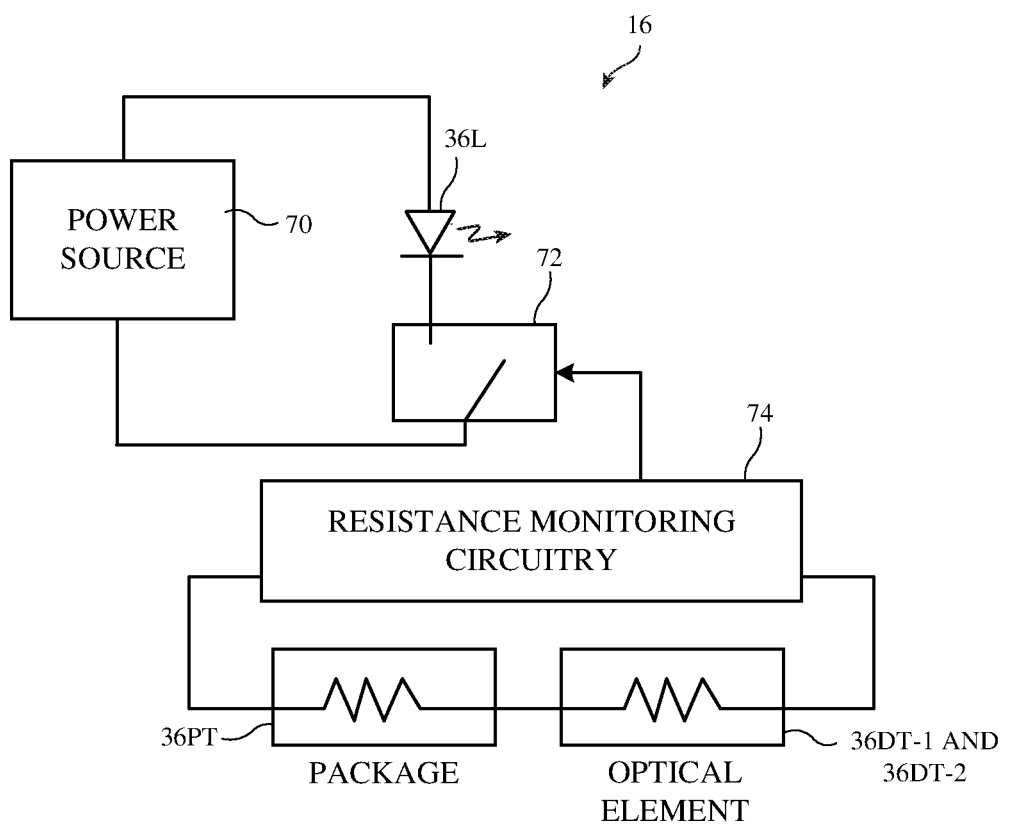
FIG. 9 is a circuit diagram of illustrative optical component integrity monitoring circuitry in accordance with an embodiment.

FIG. 9 is a circuit diagram showing how control circuitry 16 may include optical component integrity monitoring circuitry that monitors for damage to element 36D and that monitors for movement of element 36D. Power source 70 may be a battery and/or other source of power and may optionally include current limiting circuitry to enhance safety (e.g., circuitry to help limit the maximum current through device 36L and thereby limit the maximum power of the light beam emitted from device 36L). If desired, source 70 may open switch 72 or take other action to prevent excessive light emission from device 36L in response to detecting more than a desired amount of current flow through device 26L.

During normal operation, switch 72 is closed and current flows through device 36L from power source 70 so that device 36L emits light. Control circuitry such as resistance monitoring circuitry 74 measures the optical component integrity sensor paths such as the first path associated with the trace on optical element 36D and the second path associated with package 36P. The first path includes a first path segment 36DT-1 formed from metal traces on element 36D that form a failsafe resistor that can detect cracks or other damage to element 36D and includes a second path segment 36DT-2 formed from compliant signal lines such as wire bonds to help ensure a reliable connection to the first path segment. The use of the compliant path segment in the first path helps ensure that optical element damage monitoring can be performed reliably without premature detections due to small permissible amounts of movement of element 36D. The second path 36PT monitors whether package 36P has become dislodged from printed circuit 38 due to excessive movement of element 36D (e.g., movement exceeding the gap-related threshold amount of movement), thereby ensuring that undesired movement of element 36D is detected (e.g., so that excessive movement of element 36D will be detected even though such movement might not cause the compliant wire bonds of the second path segment 36DT-2 to break).

The resistances of first and second paths may be measured separately or, as shown in FIG. 9, the first and second paths may be connected in series, thereby allowing circuitry 74 to monitor the total resistance of both paths simultaneously. If an open circuit or other unexpected rise in resistance becomes present in either the first or the second path, the entire combined series-connected first and second paths will also experience an open circuit or unexpected resistance rise that can be detected by circuitry 74. In response to detecting an open circuit or other abnormal increase in resistance (e.g., an increase in resistance above a threshold or other resistance change indicative of a fault), circuitry 74 can apply a control signal to switch 72 that causes switch 72 to open and thereby block current flow to device 36L. In this way, light output from device 36L may be blocked in response to detection of a fault in optical component 36.

Figure 10:
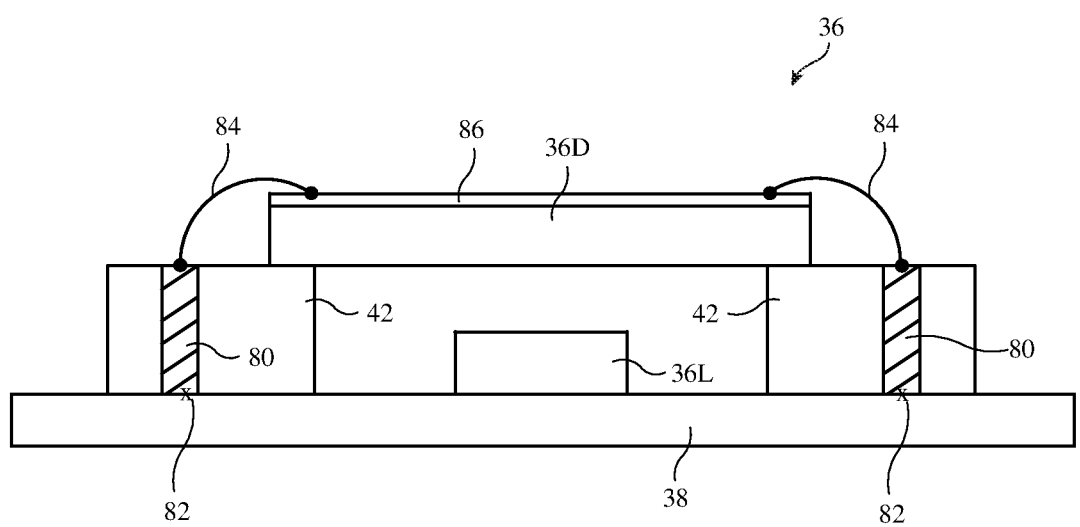
FIGS. 10 and 11 are side views of illustrative optical components with integrity monitoring circuitry in accordance with an embodiments.

If desired, the first and second paths may be formed using other types of integrity monitoring paths. FIG. 10 shows an illustrative arrangement in which support structures 42 include conductive structures 80 (e.g., metal members, thin-film coatings, wires, metal traces formed using laser-direct structuring, and/or other suitable conductive paths). Conductive structures 80 form vertical conductive paths through support structures 42. At the lower end each of structures 80, a solder connection 82 is formed with a mating contact pad on printed circuit 38. If desired, solder connections between signal paths in support 42 and board 38 may be used to detect movement of support 42. At the upper end of each of structures 80, a wire bond connection is formed with a respective wire bond 84. The other ends of wire bonds 84 are connected to the terminals of the integrity sensing path formed from thin-film metal trace 86 on optical element 36D. With this arrangement, wire bonds 84 may be shorter than the wire bonds of paths 36DT-2 of FIG. 4, thereby ensuring that wire bonds 84 will be sufficiently sensitive to movement of element 36D. At the same time, wire bonds 84 are more compliant than brittle solder connections, which can help enhance the reliability of the sensing operations performed using trace 86 (e.g., so that cracks, chips, and other damage in element 36D can be detected without risk of premature failure of the electrical connection to trace 86 from small permitted movements in element 36D).

Figure 11:
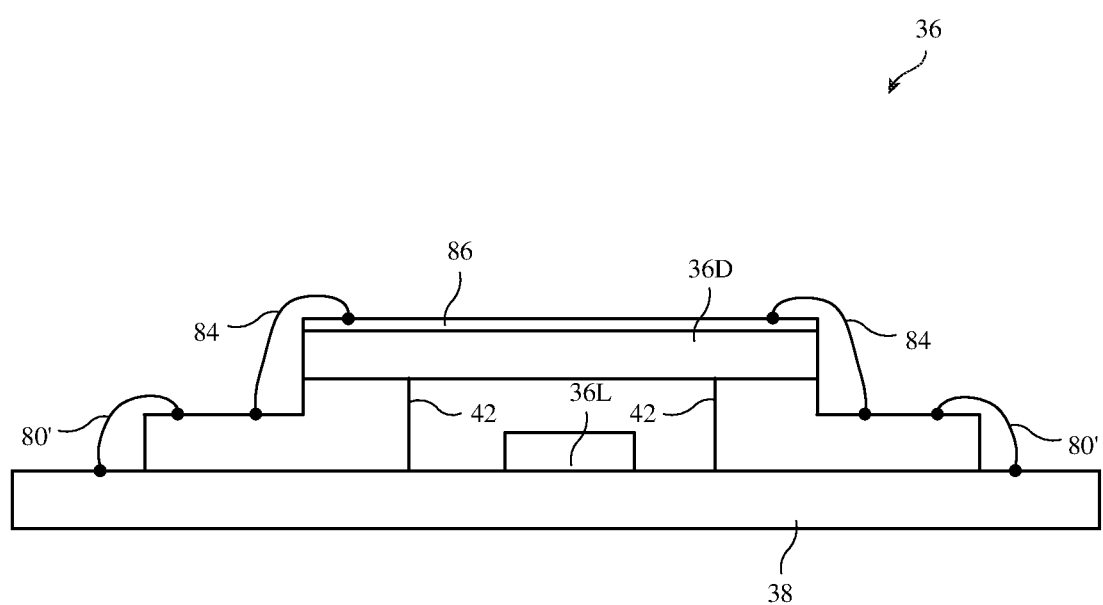

In the example of FIG. 11, two short sets of wire bonds 80' and 84 are used to couple the circuitry of printed circuit 38 to trace 86. As with the illustrative arrangement of FIG. 9, the relatively short length of wire bonds 84 may help to ensure satisfactory detection of undesired amounts of movement of element 36D with respect to printed circuit 38 while the compliance of wire bonds 84 ensures satisfactory reliability of the connection with trace 86.

In general, wire bonds in the optical component integrity monitoring circuit paths of component 36 may have any suitable length (e.g., 750 microns, at least 200 microns, at least 500 microns, less than 1.5 mm, less than 1 mm, less than 600 microns, less than 300 microns, etc.).

The foregoing is merely illustrative and various modifications can be made to the described embodiments. The foregoing embodiments may be implemented individually or in any combination.

| Table of Reference Numerals | |
| --- | --- |
| 10 | Electronic device |
| 12 | Input-output devices |
| 14 | Display |
| 18 | Sensors |
| 16 | Control circuitry |
| 22 | Housing |
| 22C | Display cover layer |
| R | Rear |
| F | Front |
| 36 | Components |
| 38 | Printed circuit |
| 30 | Interior |
| 32 | Exterior |
| 36, 36F, 36R | Components |
| 40 | Opening |
| 36P | Package |
| 36DT-1, 36DT-2, 36PT | Paths |
| 56, 44, 48, 54 | Connections |
| 50, 52, 46 | Contacts |
| 42 | Support structure |
| 70 | Power source |
| 72 | Switch |
| 74 | Circuitry |
| 80', 84 | Wire bonds |
| 80 | Conductive structures |
| 82 | Connections |
| 86 | Trace |

What is claimed is:

1. An electronic device, comprising:
   a housing;
   a printed circuit in the housing;
   an optical component coupled to the printed circuit, comprising:
      an optical element;
      a laser configured to emit light through the optical element;
      a package in which the optical element and laser are mounted; and
      an optical element integrity sensor path having a first segment formed from a metal trace on the optical element and a separate second segment coupled between the printed circuit and the first segment; and
      an optical component package integrity sensor path in the package that is connected in series with the optical element integrity sensor path.

2. The electronic device defined in claim 1 further comprising control circuitry configured to monitor a resistance of the optical element integrity sensor path and the optical component package integrity sensor path.

3. The electronic device defined in claim 2 wherein the optical element integrity sensor path is configured to increase in resistance in response to damage to the optical element.

4. The electronic device defined in claim 3 wherein the optical component package integrity sensor path is configured to detect movement of the package relative to the printed circuit due to contact between the optical element and the package.

5. The electronic device defined in claim 4 wherein the second segment comprises a wire bond.

6. The electronic device defined in claim 5 wherein the optical component package integrity sensor path comprises a conductive structure that is connected to a contact on the printed circuit with solder.

7. The electronic device defined in claim 6 wherein the package comprises polymer and wherein the conductive structure comprises a metal member that is embedded in the polymer.

8. The electronic device defined in claim 7 wherein the optical element comprises a diffuser.

9. The electronic device defined in claim 1 wherein the optical element comprises an optical element selected from the group consisting of: a diffuser, a grating, a layer with at least one lens, and a filter.

10. The electronic device defined in claim 1 further comprising:
   a switch coupled in series with the laser; and
   control circuitry configured coupled to the optical component package integrity sensing path and the optical element integrity sensing path and configured to open the switch in response to a detected resistance rise in a path formed from the optical component package integrity sensing path and the optical element integrity sensing path.

11. The electronic device defined in claim 10 further comprising a display configured to emit light through a transparent portion of the housing, wherein the optical component is configured to emit the light through the transparent portion of the housing.

12. The electronic device defined in claim 10 wherein the housing has a front and opposing rear, the electronic device further comprising a display at the front, wherein the optical component is configured to emit the light from the rear.

13. An electronic device, comprising:
   a housing;
   a printed circuit in the housing; and
   an optical component coupled to the printed circuit, comprising:
      an optical element having a metal trace forming a damage sensing resistor;
      a laser configured to emit light through the optical element;
      a wire bond connected between the damage sensing resistor and the printed circuit; and
      a package having a conductive path that is electrically connected to the printed circuit with solder joints, wherein the conductive path, the damage sensing resistor, and the wire bond are connected in series to form an optical component integrity monitoring path.

14. The electronic device defined in claim 13 further comprising optical component integrity monitoring circuitry configured to detect changes in resistance in the optical component integrity monitoring path.

15. The electronic device defined in claim 14 further comprising a switch coupled in series with the laser, wherein the optical component integrity monitoring circuitry is configured to open the switch in response to detecting that the resistance of the optical component integrity monitoring path has risen.

16. The electronic device defined in claim 15 wherein the optical element comprises a diffuser.

17. The electronic device defined in claim 16 wherein the laser comprises an infrared laser diode.

18. The electronic device defined in claim 16 further comprising a display covered by a transparent portion of the housing, wherein the optical component is an infrared flood illuminator that is configured to emit the light through the transparent portion of the housing.

19. An electronic device, comprising:
   an optical component having an optical element, a light-emitting device configured to emit light through the optical element, and a package; and
   control circuitry configured to make resistance measurements on an optical component integrity path that includes a trace on the optical element, a wire bond, and a path that passes through the package.

20. The electronic device defined in claim 19 further comprising a printed circuit, wherein the path that passes through the package is coupled to the printed circuit with solder joints.

* * * * *